(12) United States Patent
Lin et al.

(10) Patent No.: US 8,633,639 B2
(45) Date of Patent: Jan. 21, 2014

(54) MULTICHIP PACKAGE STRUCTURE AND LIGHT BULB OF USING THE SAME

(75) Inventors: Ding-Bo Lin, New Taipei (TW); Chin-Wei Hsieh, Taipei (TW); Yen-Fen Chen, Keelung (TW); Shih-Min Wu, Taoyuan County (TW); Chia-Chi Liu, Taipei (TW)

(73) Assignee: Lustrous Technology Ltd., New Taipei (TW)

( * ) Notice: Subject to any disclaimer, the term of this patent is extended or adjusted under 35 U.S.C. 154(b) by 104 days.

(21) Appl. No.: 13/344,503

(22) Filed: Jan. 5, 2012

(65) Prior Publication Data

US 2013/0175916 A1 Jul. 11, 2013

(51) Int. Cl.
*H01J 1/02* (2006.01)

(52) U.S. Cl.
USPC ............................. 313/46; 362/294

(58) Field of Classification Search
USPC ............................. 313/46; 362/294
See application file for complete search history.

(56) References Cited

U.S. PATENT DOCUMENTS

| 7,828,465 | B2* | 11/2010 | Roberge et al. | 362/294 |
| 7,974,099 | B2* | 7/2011 | Grajcar | 361/720 |
| 7,993,031 | B2* | 8/2011 | Grajcar | 362/294 |
| 2008/0285271 | A1* | 11/2008 | Roberge et al. | 362/235 |
| 2010/0025699 | A1* | 2/2010 | Liu et al. | 257/89 |
| 2010/0207534 | A1* | 8/2010 | Dowling et al. | 315/186 |
| 2010/0277904 | A1* | 11/2010 | Hanley et al. | 362/235 |
| 2011/0089830 | A1* | 4/2011 | Pickard et al. | 315/32 |
| 2011/0175527 | A1* | 7/2011 | Ramer et al. | 315/32 |
| 2011/0198979 | A1* | 8/2011 | Shum et al. | 313/46 |
| 2011/0248619 | A1* | 10/2011 | Loh | 313/46 |
| 2012/0033429 | A1* | 2/2012 | Van De Ven | 362/294 |
| 2013/0120982 | A1* | 5/2013 | Ko et al. | 362/235 |

* cited by examiner

*Primary Examiner* — Mary Ellen Bowman
(74) *Attorney, Agent, or Firm* — Li & Cai Intellectual Property (USA) Office (57) ABSTRACT

A light bulb includes a base unit, an electrical connecting unit, a light-emitting unit, and a lamp cover unit. The base unit includes a base body connected with the electrical connecting unit. The light-emitting unit includes a substrate body disposed on the base body, a plurality of blue and red light emitting groups disposed on the substrate body and electrically connected with the substrate body, and a phosphor resin body formed on the substrate body to cover the blue and red light emitting groups. Each blue light emitting group includes a plurality of blue light emitting elements electrically connected with each other in series, and each red light emitting group includes a plurality of red light emitting elements electrically connected with each other in series. The lamp cover unit includes a light-permitting cover disposed on the top side of the base body to cover the light-emitting unit.

9 Claims, 6 Drawing Sheets

MULTICHIP PACKAGE STRUCTURE AND LIGHT BULB OF USING THE SAME

BACKGROUND OF THE INVENTION

1. Field of the Invention

The instant disclosure relates to a multichip package structure and a light bulb of using the same, and more particularly, to a high-voltage multichip package structure and a light bulb of using the same.

2. Description of Related Art

The invention of the lamp greatly changed the style of building construction and the lifestyle of human beings, allowing people to work during the night. Traditional lighting devices such as lamps that adopt incandescent bulbs, fluorescent bulbs, or power-saving bulbs have been generally well-developed and used intensively for indoor illumination.

Moreover, compared to the newly developed light-emitting-diode (LED) lamps, these traditional lamps have the disadvantages of quick attenuation, high power consumption, high heat generation, short service life, high fragility, and being not recyclable. Thus, various high-powered LED lamps are created to replace the traditional lighting devices. However, the light-emitting efficiency of the LED lamp cannot be increased effectively.

SUMMARY OF THE INVENTION

One aspect of the instant disclosure relates to a high-voltage multichip package structure for increasing the light-emitting efficiency by using a plurality of high-voltage LEDs.

Another one aspect of the instant disclosure relates to a light bulb using a high-voltage multichip package structure for increasing the light-emitting efficiency by using a plurality of high-voltage LEDs.

One of the embodiments of the instant disclosure provides a light bulb using a multichip package structure, comprising: a base unit, an electrical connecting unit, a light-emitting unit, and a lamp cover unit. The base unit includes a base body having a bottom side. The electrical connecting unit has a top side connected with the bottom side of the base body, wherein the electrical connecting unit includes at least one electrical connecting element disposed on the bottom portion thereof. The light-emitting unit includes a substrate body disposed on the top side of the base body, a plurality of blue light emitting groups disposed on the substrate body and electrically connected with the substrate body, a plurality of red light emitting groups disposed on the substrate body and electrically connected with the substrate body, and a phosphor resin body formed on the substrate body to cover the blue light emitting groups and the red light emitting groups, wherein each blue light emitting group includes a plurality of blue light emitting elements electrically connected with each other in series, and each red light emitting group includes a plurality of red light emitting elements electrically connected with each other in series. The lamp cover unit includes a light-permitting cover disposed on the top side of the base body to cover the light-emitting unit.

Another one of the embodiments of the instant disclosure provides a multichip package structure, comprising: a substrate body, a plurality of blue light emitting groups, a plurality of red light emitting groups, and a phosphor resin body. The blue light emitting groups are disposed on the substrate body and electrically connected with the substrate body. The red light emitting groups are disposed on the substrate body and electrically connected with the substrate body. The phosphor resin body is formed on the substrate body to cover the blue light emitting groups and the red light emitting groups, wherein each blue light emitting group includes a plurality of blue light emitting elements electrically connected with each other in series, and each red light emitting group includes a plurality of red light emitting elements electrically connected with each other in series.

Therefore, the high-voltage blue light emitting elements and the high-voltage red light emitting elements are used in the multichip package structure and the light bulb, thus the light-emitting efficiency of the multichip package structure and the light bulb can be increased.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Referring to FIGS. 1 to 6B, where the first embodiment of the instant disclosure a light bulb Z using a multichip package structure C, comprising: a base unit 1, an electrical connecting unit 2, a light-emitting unit 3, and a lamp cover unit 4.

Figure 1:
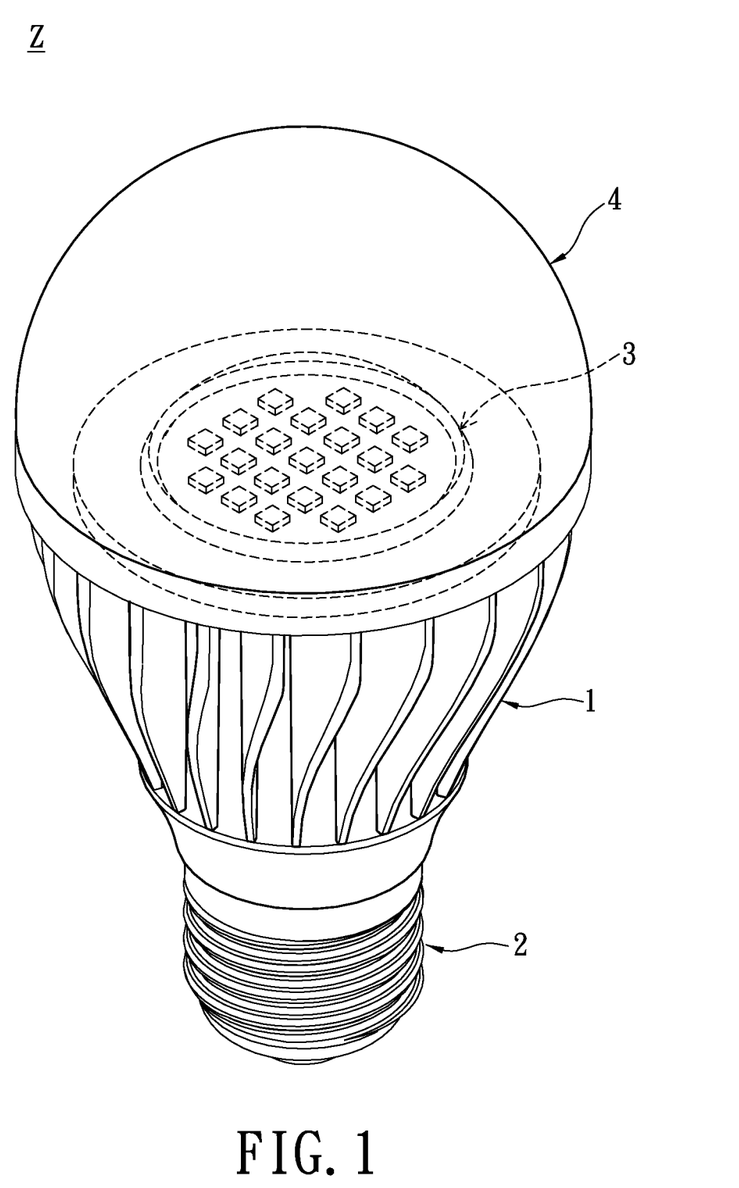
FIG. 1 shows a perspective, assembled, schematic view of the light bulb using the multichip package structure according to the first embodiment of the instant disclosure.
Figure 2:
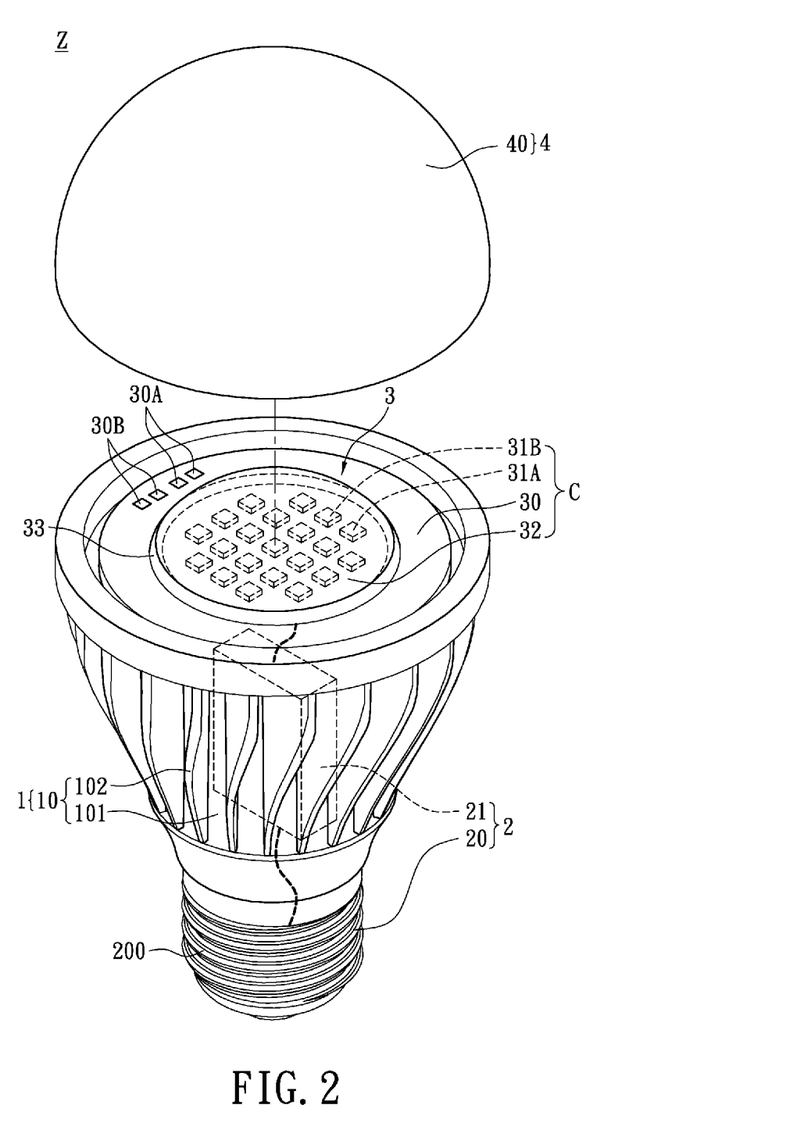
FIG. 2 shows a partial, perspective, exploded, schematic view of the light bulb using the multichip package structure according to the first embodiment of the instant disclosure.

Referring to FIGS. 1 and 2, the base unit 1 includes a base body 10 having a bottom side. For example, the base body 10 may be composed of a heat-dissipating body 101 and a plurality of heat-dissipating fins 102 surrounding the heat-dissipating body 101 and disposed on the outer surrounding peripheral surface of the heat-dissipating body 101, and the heat-dissipating fins 102 can be integrated with the heat-dissipating body 101. However, the base body 10 used in the first embodiment is merely an example and is not meant to limit the instant disclosure.

Referring to FIGS. 1 and 2, the electrical connecting unit 2 has a top side connected with the bottom side of the base body 10, and the electrical connecting unit 2 includes at least one electrical connecting element 20 disposed on the bottom portion thereof. For example, the electrical connection element 20 may be an electrical connector having a securing screw 200 formed on the external surrounding surface of the electrical connector, thus the electrical connection element 20 of the light bulb Z can be positioned in a power socket (not shown) by rotating to obtain power supply. In addition, the electrical connection unit 2 includes a drive IC module 21 disposed inside the base body 10, and the drive IC module 21 is electrically connected between the electrical connecting element 20 and the light-emitting unit 3 in order to transform voltage from AC (alternating current) into DC (Direct current), thus the instant disclosure can provide DC for the light-emitting unit 3.

Referring to FIGS. 1 and 2, the light-emitting unit 3 includes a substrate body 30 disposed on the top side of the base body 10, a plurality of blue light emitting groups 31A disposed on the substrate body 30 and electrically connected with the substrate body 30, a plurality of red light emitting groups 31B disposed on the substrate body 30 and electrically connected with the substrate body 30, and a phosphor resin body 32 formed on the substrate body 30 to cover the blue light emitting groups 31A and the red light emitting groups 31B. Moreover, the light-emitting unit 3 further includes a light-reflecting frame 33 disposed on the substrate body 30 and simultaneously surrounding the blue light emitting groups 31A and the red light emitting groups 31B, and the phosphor resin body 32 is surrounded by the light-reflecting frame 33 and contacts the inner surface 330 of the light-reflecting frame 33. In addition, the substrate body 30, the blue light emitting groups 31A, the red light emitting groups 31B, and the phosphor resin body 32 can combined to form the multichip package structure C.

Figure 3:
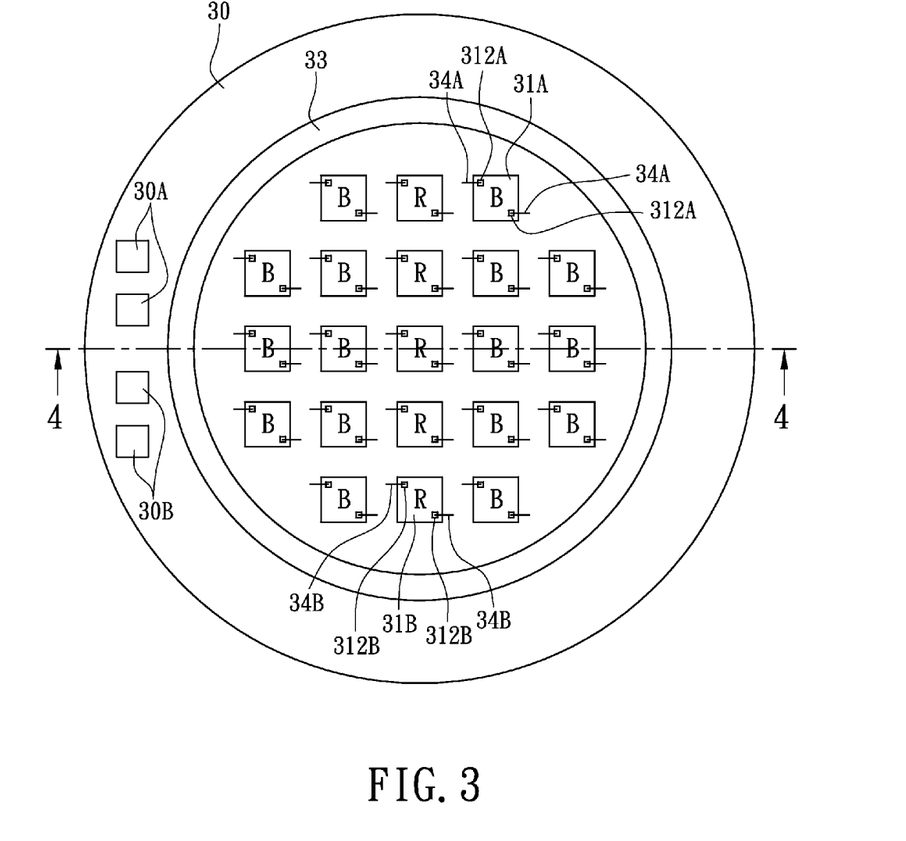
FIG. 3 shows a top, schematic view before covering the light-emitting unit with the phosphor resin body according to the first embodiment of the instant disclosure.

Referring to FIGS. 2 and 3, FIG. 3 shows a top, schematic view before covering the light-emitting unit 3 with the phosphor resin body 32. The substrate body 30 has at least two first outer conductive pads 30A electrically connected to the drive IC module 21, and each first outer conductive pad 30A is electrically connected to the blue light emitting groups 31A (each blue light emitting group 31A is defined by the English letter "B" as shown in FIG. 3). The substrate body 30 has at least two second outer conductive pads 30B electrically connected to the drive IC module 21, and each second outer conductive pad 30B is electrically connected to the red light emitting groups 31B (each red light emitting group 31B is defined by the English letter "R" as shown in FIG. 3).

For example, the substrate body 30 may be a circuit substrate having a plurality of conductive tracks (not shown) disposed on the top surface thereof, and the conductive tracks (not shown) can be used as the bridge for electrically connecting each blue light emitting group 31A with the substrate body 30, as the bridge for electrically connecting each red light emitting group 31B with the substrate body 30, as the bridge for electrically connecting each corresponding first outer conductive pad 30A with each corresponding blue light emitting group 31A, and as the bridge for electrically connecting each corresponding second outer conductive pad 30B with each corresponding red light emitting group 31B.

For example, the two first outer conductive pads 30A can be defined as a positive electrode pad and a negative electrode pad, and the two second outer conductive pads 30B can be defined as a positive electrode pad and a negative electrode pad. Hence, when the electric currents are provided to the two first outer conductive pads 30A, the blue light emitting groups 31A can be lighted up at the same time. When the electric currents are provided to the two second outer conductive pads 30B, the red light emitting groups 31B can be lighted up at the same time. In other words, the blue light emitting groups 31A and the red light emitting groups 31B can be selectively lighted up according to different requirement, such as (1) only the blue light emitting groups 31A are lighted up, (2) only the red light emitting groups 31B are lighted up, or (3) the blue light emitting groups 31A and the red light emitting groups 31B are simultaneously lighted up.

Of course, more than two first outer conductive pads 30A can be disposed on the substrate body 30, thus the blue light emitting groups 31A can be selectively lighted up for generating the light-emitting area of different sizes. In other words, the blue light emitting groups 31A can be divided into two illumination units, the two illumination units of the blue light emitting groups 31A can be selectively lighted up simultaneously or respectively for selectively generating the light-emitting area of different sizes. In the same principle, more than two second outer conductive pads 30B can be disposed on the substrate body 30, thus the red light emitting groups 31B can be selectively lighted up for generating the light-emitting area of different sizes. In other words, the red light emitting groups 31B can be divided into two illumination units, the two illumination units of the red light emitting groups 31B can be selectively lighted up simultaneously or respectively for selectively generating the light-emitting area of different sizes. Of course, the blue light emitting groups 31A can be sequentially lighted up, the red light emitting groups 31B can be sequentially lighted up, or the blue light emitting groups 31A and the red light emitting groups 31B can be alternately lighted up, according to different requirements. However, the method for lighting up the blue light emitting groups 31A and the red light emitting groups 31B in the first embodiment is merely an example and is not meant to limit the instant disclosure.

Figure 6A:
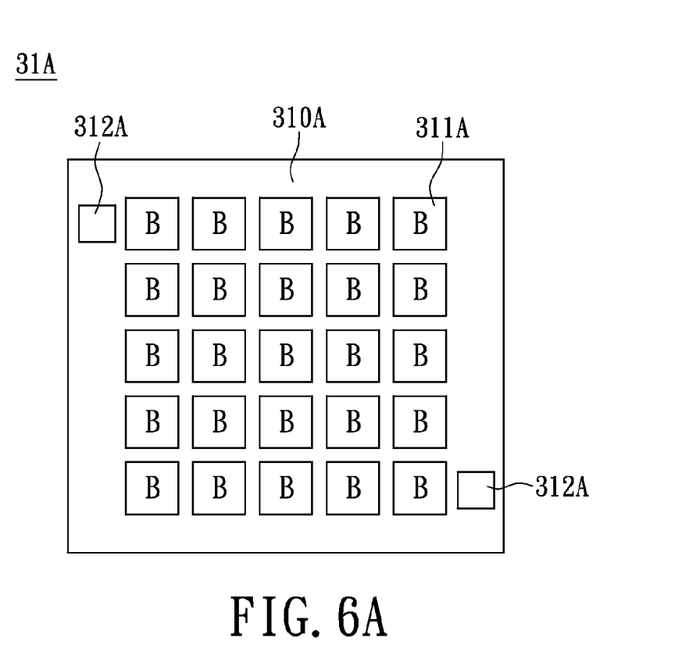
FIG. 6A shows a top, schematic view of the blue light emitting groups according to the first embodiment of the instant disclosure.

Referring to FIGS. 3 and 6A, FIG. 6A shows a top, schematic view of the single blue light emitting group 31A. Each blue light emitting group 31A includes a first module substrate 310A, a plurality of blue light emitting elements 311A (each blue light emitting elements 311A is defined by the English letter "B" as shown in FIG. 6A) disposed on the first module substrate 310A and electrically connected with each other in series, and at least two first inner conductive pads 312A disposed on the first module substrate 310A and electrically connected to the blue light emitting elements 311A. For example, each first inner conductive pad 312A can be disposed on the top surface of the first module substrate 310A. Each blue light emitting element 311A may be a micro high-voltage blue LED bare chip that can use the high voltage between 40V to 60V, but the high voltage range for each blue light emitting element 311A is not meant to limit the instant disclosure.

Figure 6B:
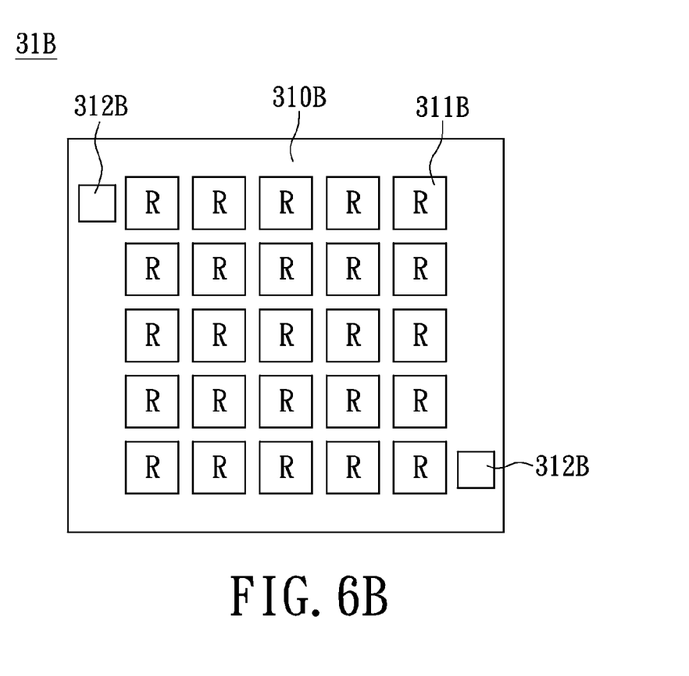
FIG. 6B shows a top, schematic view of the red light emitting groups according to the first embodiment of the instant disclosure.

Referring to FIGS. 3 and 6B, FIG. 6B shows a top, schematic view of the single red light emitting group 31B. Each red light emitting group 31B includes a second module substrate 310B, a plurality of red light emitting elements 311B (each red light emitting elements 311B is defined by the English letter "R" as shown in FIG. 6B) disposed on the second module substrate 310B and electrically connected with each other in series, and at least two second inner conductive pads 312B disposed on the second module substrate 310B and electrically connected to the red light emitting elements 311B. For example, each second inner conductive pad 312B can be disposed on the top surface of the second module substrate 310B. Each red light emitting element 311B may be a micro high-voltage red LED bare chip that can use the high voltage about 30V, but the high voltage range for each red light emitting element 311B is not meant to limit the instant disclosure.

Figure 4:
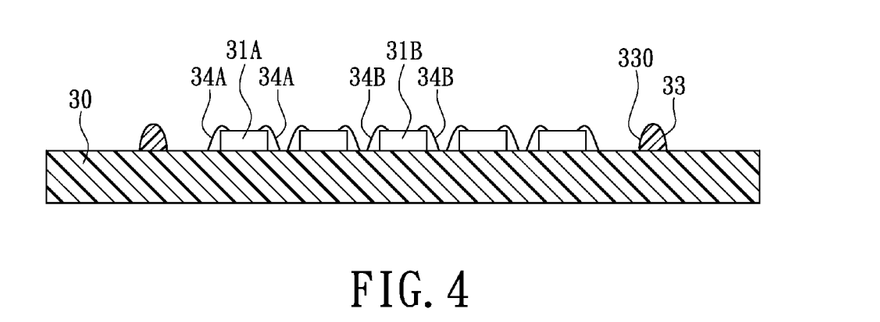
FIG. 4 shows a cross-sectional view taken along the section line 4-4 of FIG. 3.

Referring to FIGS. 3 and 4, the light-emitting unit 3 includes a plurality of first conductive elements 34A and a plurality of second conductive elements 34B. Each first conductive element 34A is electrically connected between each corresponding first inner conductive pad 312A and the substrate body 30, and each second conductive element 34B is electrically connected between each corresponding second inner conductive pad 312B and the substrate body 30. For example, each first conductive element 34A may be a metal conductive wire, thus each first conductive element 34A can be electrically connected between each corresponding first inner conductive pad 312A and the substrate body 30 by wire bonding. In addition, each second conductive element 34B may be a metal conductive wire, thus each second conductive element 34B can be electrically connected between each corresponding second inner conductive pad 312B and the substrate body 30 by wire-bonding.

Figure 5:
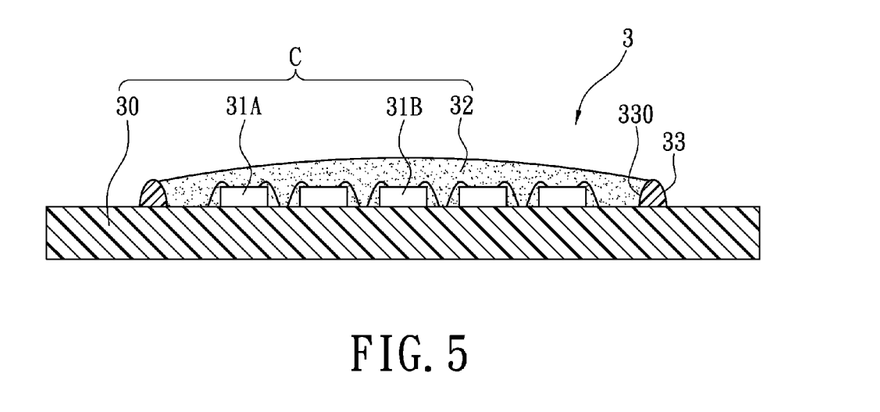
FIG. 5 shows a top, schematic view after covering the light-emitting unit with the phosphor resin body according to the first embodiment of the instant disclosure.

Referring to FIGS. 4 and 5, FIG. 5 shows a top, schematic view after covering the light-emitting unit 3 with the phosphor resin body 32. When the phosphor resin body 32 is formed on the substrate body 30 to cover the blue light emitting groups 31A and the red light emitting groups 31B, the phosphor resin body 32 can be surrounded by the light-reflecting frame 33 and contacts the inner surface 330 of the light-reflecting frame 33. For example, the phosphor resin body 32 may be formed by mixing silicone and phosphor powder or by mixing epoxy and phosphor powder. In addition, the substrate body 30, the blue light emitting groups 31A, the red light emitting groups 31B, and the phosphor resin body 32 can combined to form the multichip package structure C.

Referring to FIGS. 1 and 2, the lamp cover unit 4 includes a light-permitting cover 40 disposed on the top side of the base body 10 to cover the light-emitting unit 3. For example, the bottom portion of the light-permitting cover 40 is mated with the top side of the base body 10, thus the light-permitting cover 40 can be fixed on the base body 10. In addition, the light diffusing particles can be added to the light-permitting cover 40 to increase the luminous uniformity of the light bulb Z.

Second Embodiment

Figure 7:
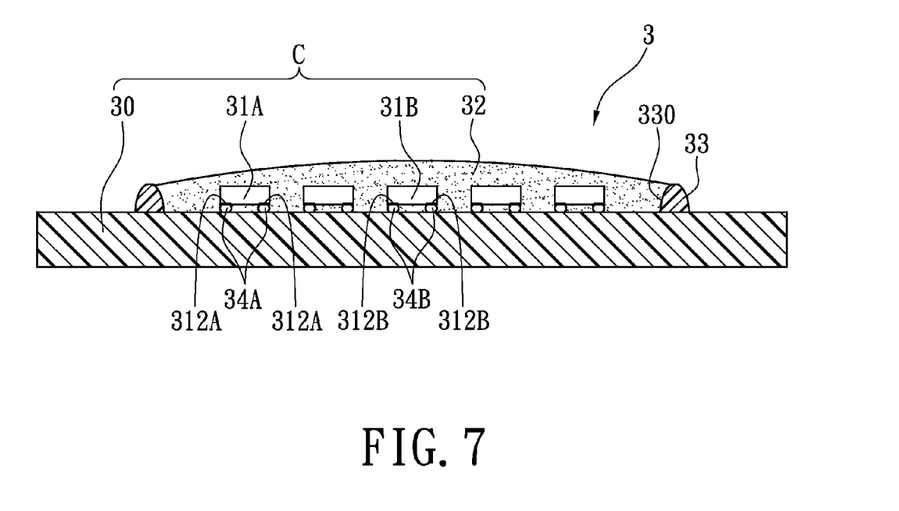
FIG. 7 shows a top, schematic view after covering the light-emitting unit with the phosphor resin body according to the second embodiment of the instant disclosure.

Referring to FIG. 7, the second embodiment of the instant disclosure provides a multichip package structure C. Comparing FIG. 7 with FIG. 5, the difference between the second embodiment and the first embodiment is as follows: in the second embodiment, each first inner conductive pad 312A is disposed on the bottom surface of the first module substrate 310A, and each second inner conductive pad 312B is disposed on the bottom surface of the second module substrate 310B. For example, each first conductive element 34A may be a solder ball, thus each first conductive element 34A can be electrically connected between each corresponding first inner conductive pad 312A and the substrate body 30 by a flip-chip method. In addition, each second conductive element 34B may be a solder ball, thus each second conductive element 34B can be electrically connected between each corresponding second inner conductive pad 312B and the substrate body 30 by a flip-chip method.

In conclusion, the high-voltage blue light emitting elements (the micro high-voltage blue LED bare chips) and the high-voltage red light emitting elements (the micro high-voltage red LED bare chips) are used in the multichip package structure and the light bulb, thus the light-emitting efficiency of the multichip package structure and the light bulb can be increased.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A light bulb using a multichip package structure, comprising:
   a base unit including a base body having a bottom side;
   an electrical connecting unit having a top side connected with the bottom side of the base body, wherein the electrical connecting unit includes at least one electrical connecting element disposed on the bottom portion thereof;
   a light-emitting unit including a substrate body disposed on the top side of the base body, a plurality of blue light emitting groups disposed on the substrate body and electrically connected with the substrate body, a plurality of red light emitting groups disposed on the substrate body and electrically connected with the substrate body, and a phosphor resin body formed on the substrate body to cover the blue light emitting groups and the red light emitting groups, wherein each blue light emitting group includes a plurality of blue light emitting elements electrically connected with each other in series, and each red light emitting group includes a plurality of red light emitting elements electrically connected with each other in series; and
   a lamp cover unit including a light-permitting cover disposed on the top side of the base body to cover the light-emitting unit;
   wherein each blue light emitting group includes a first module substrate and at least two first inner conductive pads disposed on the first module substrate and electrically connected to the blue light emitting elements, and each red light emitting group includes a second module substrate and at least two second inner conductive pads disposed on the second module substrate and electrically connected to the red light emitting elements.

2. The light bulb of claim 1, wherein the base body is composed of a heat-dissipating body and a plurality of heat-dissipating fins surrounding the heat-dissipating body and disposed on the heat-dissipating body.

3. The light bulb of claim 1, wherein the electrical connecting unit includes a drive IC module disposed inside the base body, and the drive IC module is electrically connected between the at least one electrical connecting element and the light-emitting unit.

4. The light bulb of claim 3, wherein the substrate body has at least two first outer conductive pads electrically connected to the drive IC module, and each first outer conductive pad is simultaneously electrically connected to the blue light emitting groups and the red light emitting groups.

5. The light bulb of claim 3, wherein the substrate body has at least two first outer conductive pads electrically connected to the drive IC module, and each first outer conductive pad is electrically connected to the blue light emitting groups, wherein the substrate body has at least two second outer conductive pads electrically connected to the drive IC module, and each second outer conductive pad is electrically connected to the red light emitting groups.

6. The light bulb of claim 1, wherein the substrate body is a circuit substrate, each blue light emitting element is a micro blue LED bare chip, and each red light emitting element is a micro red LED bare chip.

7. The light bulb of claim 1, wherein the light-emitting unit includes a plurality of first conductive elements and a plurality of second conductive elements, each first conductive element is electrically connected between each corresponding first inner conductive pad and the substrate body, and each second conductive element is electrically connected between each corresponding second inner conductive pad and the substrate body.

8. The light bulb of claim 1, wherein the light-emitting unit includes a light-reflecting frame disposed on the substrate body and simultaneously surrounding the blue light emitting groups and the red light emitting groups, and the phosphor resin body is surrounded by the light-reflecting frame and contacts the inner surface of the light-reflecting frame.

9. A multichip package structure, comprising:
a substrate body;
a plurality of blue light emitting groups disposed on the substrate body and electrically connected with the substrate body;
a plurality of red light emitting groups disposed on the substrate body and electrically connected with the substrate body; and
a phosphor resin body formed on the substrate body to cover the blue light emitting groups and the red light emitting groups, wherein each blue light emitting group includes a plurality of blue light emitting elements electrically connected with each other in series, and each red light emitting group includes a plurality of red light emitting elements electrically connected with each other in series;

wherein each blue light emitting group includes a first module substrate and at least two first inner conductive pads disposed on the first module substrate and electrically connected to the blue light emitting elements, and each red light emitting group includes a second module substrate and at least two second inner conductive pads disposed on the second module substrate and electrically connected to the red light emitting elements.

* * * * *